United States Patent

Wuchert

(10) Patent No.: US 9,476,904 B2
(45) Date of Patent: Oct. 25, 2016

(54) ACCELERATION SENSOR HAVING AT LEAST ONE MICROMECHANICAL SENSOR ELEMENT FOR AN OCCUPANT PROTECTION SYSTEM IN A VEHICLE

(71) Applicant: Robert Bosch GmbH, Stuttgart (DE)

(72) Inventor: Thomas Wuchert, Dermbach (DE)

(73) Assignee: ROBERT BOSCH GMBH, Stuttgart (DE)

(*) Notice: Subject to any disclaimer, the term of this patent is extended or adjusted under 35 U.S.C. 154(b) by 222 days.

(21) Appl. No.: 14/386,079

(22) PCT Filed: Feb. 12, 2013

(86) PCT No.: PCT/EP2013/052781
§ 371 (c)(1),
(2) Date: Sep. 18, 2014

(87) PCT Pub. No.: WO2013/139533
PCT Pub. Date: Sep. 26, 2013

(65) Prior Publication Data
US 2015/0075286 A1   Mar. 19, 2015

(30) Foreign Application Priority Data
Mar. 20, 2012 (DE) .......... 10 2012 204 438

(51) Int. Cl.
| | | |
|---|---|---|
| *G01P 21/00* | (2006.01) | |
| *G01P 15/08* | (2006.01) | |
| *H03M 1/10* | (2006.01) | |
| *H03M 1/06* | (2006.01) | |
| *B60R 21/013* | (2006.01) | |

(52) U.S. Cl.
CPC ............ *G01P 15/08* (2013.01); *B60R 21/013* (2013.01); *G01P 21/00* (2013.01); *H03M 1/0678* (2013.01); *H03M 1/1071* (2013.01)

(58) Field of Classification Search
CPC ...... G01P 21/00; G01P 15/08; B60R 21/013; B60R 21/0132; B60R 21/0173; B60R 2021/0119; B60R 2021/01184; H03M 1/1071; H03M 1/06; H03M 1/0675; H03M 1/0678; H03M 1/068; H03M 1/0687
See application file for complete search history.

(56) References Cited

U.S. PATENT DOCUMENTS

| | | | |
|---|---|---|---|
| 6,292,728 B1 | 9/2001 | Masegi | |
| 6,513,832 B1* | 2/2003 | Mader ................. | B60R 21/0132 180/282 |
| 8,992,080 B2* | 3/2015 | Lepidis ................. | G01K 7/01 374/142 |
| 2010/0179722 A1 | 7/2010 | Suetsugu et al. | |
| 2010/0271000 A1* | 10/2010 | Schaetzle ............ | H03M 1/1071 324/72 |

FOREIGN PATENT DOCUMENTS

| | | |
|---|---|---|
| DE | 197 05 406 | 8/1998 |
| DE | 103 06 707 | 8/2004 |
| EP | 2 088 043 | 8/2009 |

OTHER PUBLICATIONS

International Search Report, PCT International Application No. PCT/EP2013/052781, dated May 8, 2013.

* cited by examiner

*Primary Examiner* — Blake A Tankersley
(74) *Attorney, Agent, or Firm* — Norton Rose Fulbright US LLP

(57) ABSTRACT

In an acceleration sensor having two redundantly disposed micromechanical sensor elements having redundant signal paths with a separate A/D converter, a monitor includes a substitute circuit, integrated in the evaluation unit, for a sensor element, and a redundant further A/D converter, which converts the fixed, acceleration-independent output signal of the substitute circuit as a function of the shared operating parameters of all A/D converters to plausibilize the output signals of the acceleration sensor by means of the monitor. This makes it possible to detect faulty triggering of an airbag due to faults in both A/D converters.

7 Claims, 2 Drawing Sheets

ACCELERATION SENSOR HAVING AT LEAST ONE MICROMECHANICAL SENSOR ELEMENT FOR AN OCCUPANT PROTECTION SYSTEM IN A VEHICLE

FIELD

The present invention relates to an acceleration sensor for an occupant protection system in a vehicle, which has at least one micromechanical sensor element for an acceleration pickup, and an electronic evaluation unit, which has a redundant signal path with a separate A/D converter for each sensor element; in addition, an arrangement is provided to monitor parameters of the at least one A/D converter that are relevant for the functionality in order to plausibilize the output signals of the acceleration sensor.

BACKGROUND INFORMATION

A generic acceleration sensor is described in German Patent No. DE 103 06 707 B4, for instance.

In the context of protecting vehicle occupants in the event of a collision, it is generally conventional to use acceleration sensors to acquire acceleration values at different locations in the vehicle, and to trigger restraints such as airbags and belt tensioners using a control unit as a function of acquired acceleration values. However, the protection system must be monitored for faults, since an undesired triggering of the restraint caused by a malfunction could endanger the occupants of the vehicle as well as other people, especially when the vehicle is moving. Causes of such faulty triggering, e.g., electromagnetic irradiation, thermal stresses or interruptions in the supply voltage of the sensors, may already arise at the level of the acceleration sensors.

To prevent faulty triggering of an airbag already at the level of the acceleration sensor, it is conventional to provide two redundant micromechanical sensor elements (MEMS: MicroElectroMechanical Systems) in the sensor, which mutually plausibilize each other. However, when the signals emitted by the two sensor elements are read into the microcontroller of the control unit with the aid of the jointly utilized A/D converter, which is part of the sensor, faulty triggering may occur despite the redundant sensor elements, if the A/D converter is not functioning properly. To prevent this from happening, an expansion of the redundancy in the acceleration sensor to the entire signal path may occur, so that a separate A/D converter is available for each sensor element. However, since the A/D converters respond very sensitively to their environment or to the operating conditions, such as supply voltage fluctuations, temperature or aging, the parameters jointly used for both A/D converters and relevant for the functionality must additionally be monitored with regard to compliance with specified limits (e.g., relating to low voltages or EMC interference). Straying from such limits could otherwise lead to a common mode signal in both signal paths and thus to a faulty acceleration signal, despite the fact that no acceleration is taking place. The realization of such a redundancy in the supply concept of the A/D converters or the implementation of the required monitoring means or monitors, such as for a low voltage detection, EMC detection, reference voltage and current detection for the A/D converters, is costly and requires large chip surfaces, however.

SUMMARY

Therefore, it is an object of the present invention to provide an improved, especially a simplified, acceleration sensor of the type mentioned in the introduction.

The monitor in the acceleration sensor according to the present invention includes a substitute circuit, integrated in the evaluation unit, for a sensor element, and a redundant further A/D converter, which reacts to changes in the parameters relevant for the functionality in the same sense as the at least one A/D converter (4, 5). The further A/D converter (9) converts the fixed acceleration-independent output signal of the substitute circuit, and a comparator compares the value of the digital output signal of the further A/D converter (9) with a predefined fixed limit (12), so that changes in the parameters, relevant for the functionality, of all A/D converters may be detected.

In accordance with the present invention, a redundant monitoring-signal path is implemented, whose monitoring or safety A/D converter responds in the same sense as the signal A/D converters to interruptions that uniformly affect the parameters of all A/D that are relevant for the functionality. In contrast to the output signals of the signal A/D converters, however, a fault that is impressed on the output signal of the monitoring A/D converter is easily detectable, since it cannot possibly be traced back to a real acceleration signal; instead, due to the fixed acceleration-independent input signal of the monitoring A/D converter, which is generated by a substitute circuit which copies or simulates the properties of a real micromechanical sensor element, more precisely, its neutral state, it images the fault directly. As soon as such a fault appears in the output signal of the monitoring A/D converter, or as soon as a predefinable tolerance threshold is exceeded, the output signals of the signal A/D converters are consequently no longer to be evaluated as plausible, but rather as faulty.

An example acceleration sensor of the present invention may have the advantage of realizing a redundancy with regard to the supply or the monitoring in a simple manner, generally by implementing a further A/D converter of the same type in the evaluation unit, or by plausibilizing the shared situation of the A/D converters with regard to compliance with the predefined limits. This makes it possible to save costs that arise in connection with the development work and surface area on the ASIC of the evaluation unit.

According to a first further development of the present invention, the acceleration sensor supplies either the result of the plausibility check together with the output signals for the external evaluation, or the transmission of output signals of the acceleration sensor that were evaluated as faulty is prevented. That is to say, the evaluation of the plausibility may advantageously take place either in the external control unit or in the acceleration sensor itself.

In one additional further refinement of the present invention, which is considered to be particularly advantageous, at least one further substitute circuit for a sensor element is integrated in the evaluation unit; this further substitute circuit generates a fixed output signal that differs from the substitute circuit, so that the input signal of the additional A/D converter is variable for the purpose of checking the functionality of the monitoring means, by switching from the substitute circuit to an additional substitute circuit. In this way the functionality of the monitoring or the monitor for the parameters that are relevant for the functionality may itself be checked on a continuous basis.

BRIEF DESCRIPTION OF THE DRAWINGS

The present invention is explained below on the basis of exemplary embodiments.

DETAILED DESCRIPTION OF EXAMPLE EMBODIMENTS

Figure 1:
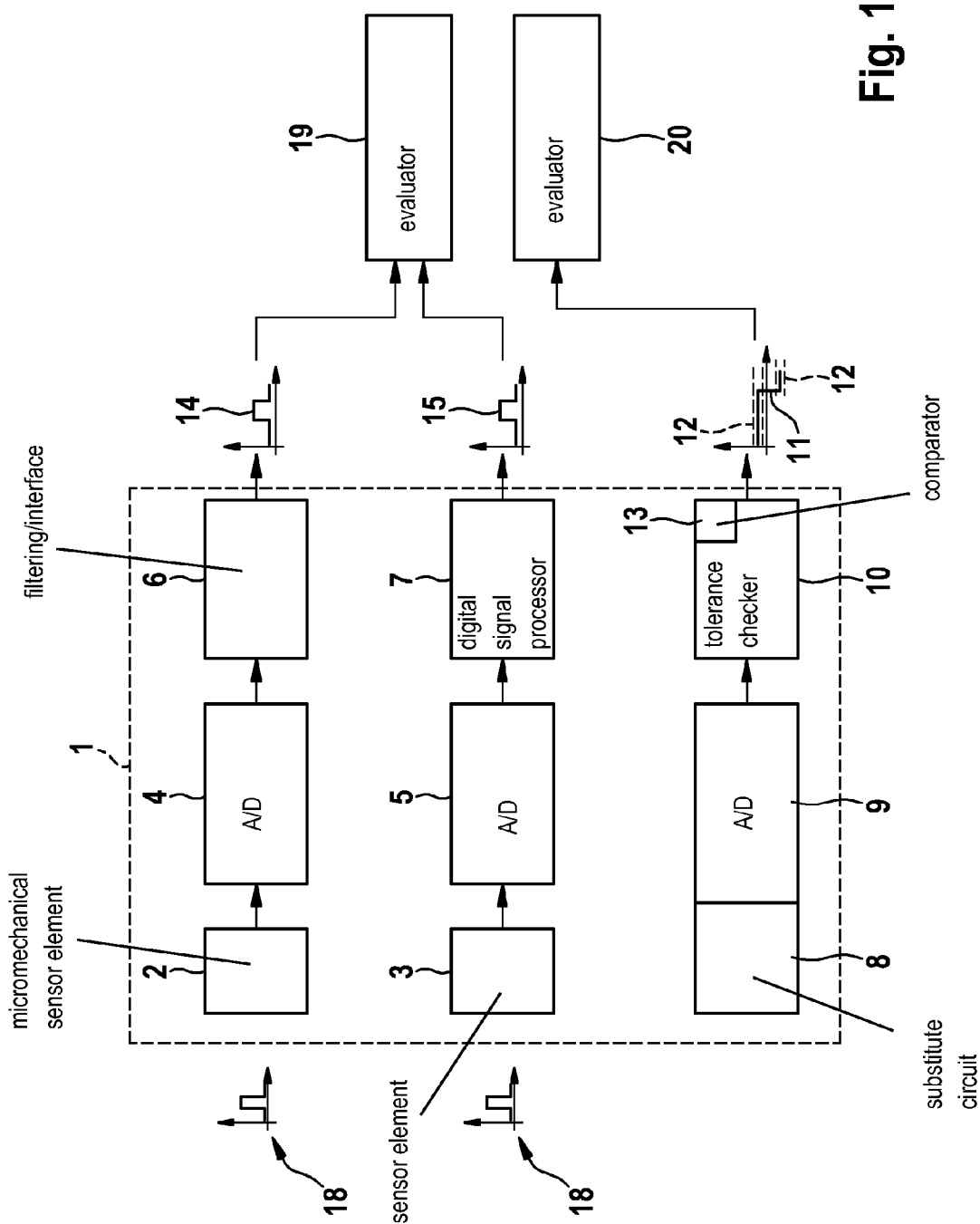
FIG. 1 shows a schematic sketch, which explains the components and functions of one development of an example acceleration sensor according to the present invention for a standard situation.

The following exemplary embodiment is based on an airbag, whose triggering by means of an individual acceleration sensor is plausibilized using two sensor elements, which are integrated in a so-called 45-degree application. The acceleration in the event of an impact is measured by means of the two micromechanical elements (MEMS) (which are situated on a first chip of the acceleration sensor) and then converted by separate A/D converters on an ASIC (second chip of the acceleration sensor). This digital acceleration information from the two separate MEMS channels is transmitted to the airbag control unit for processing, and after its evaluation, the airbag is able to be triggered. To ensure that a single fault on the ASIC does not lead to a same mode signal or a counter clock signal at the output of the two channels of the sensor, the acceleration information is routed through spatially separate A/D converters on the ASIC in a manner known per se.

To monitor the shared environmental conditions or input parameters of the two signal A/D converters with regard to the generation of faulty signals, the present invention uses a direct copy of the signal A/D converters for the monitoring, i.e., a third A/D converter, which is likewise implemented on the ASIC, but in a separate location from the first and second A/D converters. This ensures that the reaction of this monitoring A/D converter to changes in the environment or the operating parameters is similar to the changes that the faulty signal A/D converters impress on their individual input signals. The third monitoring A/D converter converts the signal from a copy of the MEMS elements, held in readiness on the ASIC in the form of a substitute circuit; the signal remains unchanged, of course (with regard to accelerations), but is a function of the parameters that are relevant for the functionality. Since the micromechanical sensor elements typically have an immovable and a moveable comb structure for an acceleration pickup, produced using surface micromachining technology, which jointly form a capacitor having a capacitance that is variable as a function of the acceleration, the substitute circuit for the 'sensor element copy' preferably has the same (but nonvariable) capacitance C as the original micromachined sensor element in the neutral state. The substitute circuit may furthermore have a resistance R, which is dimensioned such that the monitoring A/D converter encounters the same impedance as in a real sensor element.

The converted value at the output of the third A/D converter is then compared to a fixed limit. For example, if the reference voltage of all A/D converters fails, then this will lead to a common mode acceleration in the signal A/D converters without signals being applied at the input of the signal A/D converters, because of a lack of acceleration. Since the monitoring A/D converter is connected to the same references, it will likewise exhibit a jump in the output signal. This jump would exceed the previously set tolerance limit and therefore fail to plausibilize the digital acceleration information of the signal A/D converters, but mark it as faulty instead. Faulty triggering of the airbag therefore does not take place. Furthermore, apart from the failure of jointly utilized reference voltages, the following further shared parameters of the signal A/D converters are able to be monitored as well:

peaks and noise on the supply, for instance as a result of EMC, sensitivity changes of the signal A/D converters due to temperature or aging, all jointly utilized voltages and currents.

FIG. 1 illustrates a standard case, in which an acceleration is present. The actually existing acceleration is sketched in the left part of FIG. 1 in the form of small acceleration diagrams 18 that are drawn outside acceleration sensor 1. The associated acceleration signal is generated in first micromechanical sensor element 2, converted in associated first A/D converter 4 assigned to this MEMS channel or signal path, and digitally conditioned by means 6 (filtering or interface functions, respectively). A redundantly configured second MEMS channel or second signal path including second sensor element 3, associated second A/D converter 5 and means 7 for the digital signal processing (digital signal processor) is shown as well. Both channels of sensor 1 generate, correctly in the case illustrated, the same plausibilized output signal 14 and 15 (see the digital data word sketched in the right part of FIG. 1). In the standard case assumed here (acceleration; no fault), substitute circuit 8 generates the provided acceleration-independent standard value, which is converted by monitoring A/D converter 9 and then checked by means 10, especially a comparator 13, as to whether the associated output signal 11 lies within the predefined tolerance limits 12. This is the case here, since it is assumed that no fault is present, i.e., no abnormal or changed parameters relevant for the functionality, to which third A/D converter 9 could react. Incidentally, the three A/D converters 4, 5 and 9 could advantageously be designed as generally known so-called sigma delta modulators.

Next, digital output signals 14 and 15 together with monitoring signal 11 are transmitted to an external control unit. There, in a unit 20, the two output signals 14 and 15 are able to be evaluated as plausible based on monitoring signal 11 and possibly also be mutually plausibilized in a further unit 19. The evaluation based on monitoring signal 11 may also take place internally within the sensor, however, so that acceleration sensor 1 as a rule transmits only plausibilized output signals 14 and 15.

Figure 2:
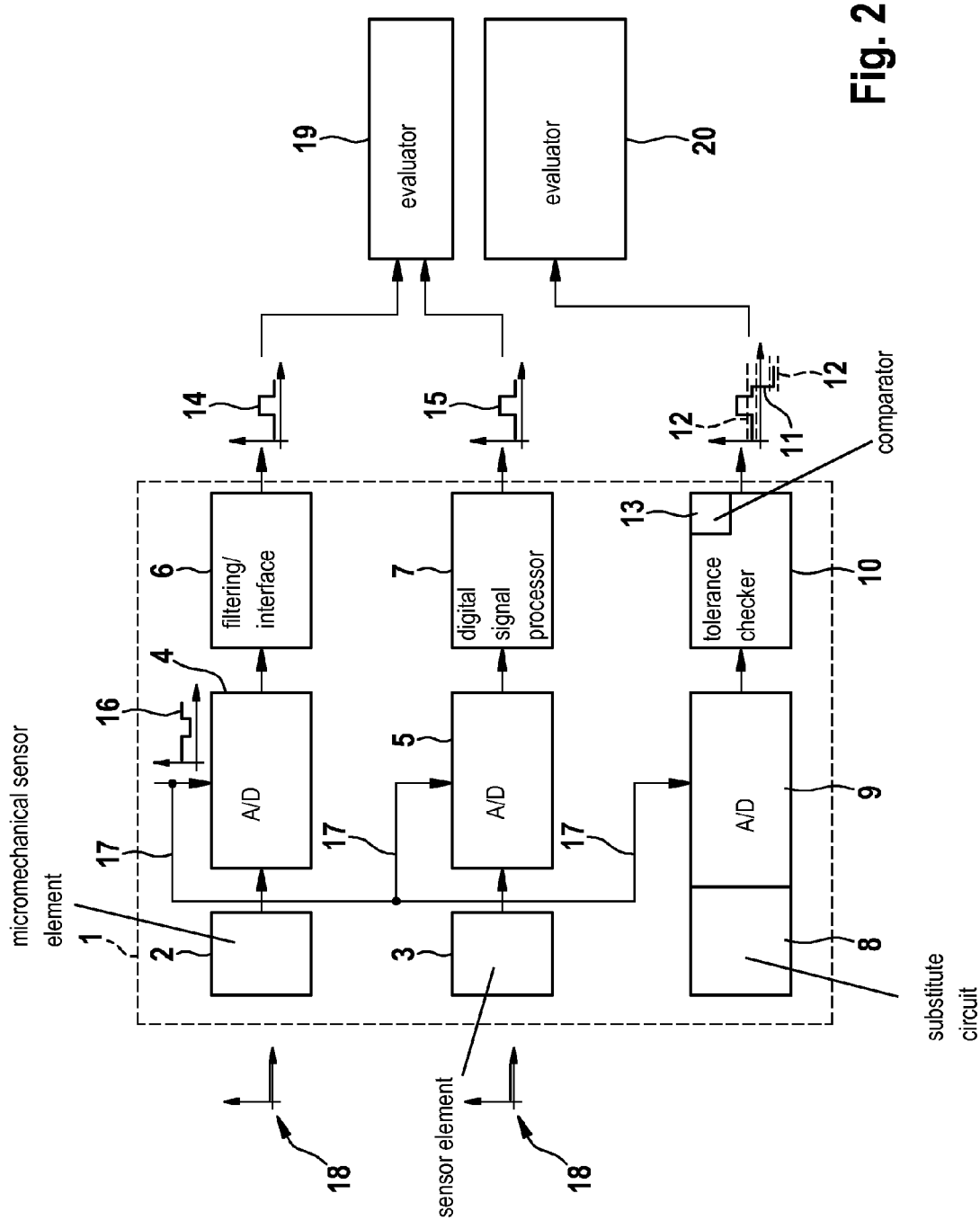
FIG. 2 shows, in the same representation, an illustration of a fault case.

FIG. 2 shows a fault case, in the same representation as in FIG. 1, in which no acceleration is present, so that the signals at the output of signal A/D converter 4 and 5 are triggered by a fault, more precisely, a voltage fluctuation 16 sketched in FIG. 2. This voltage fluctuation 16, as illustrated, is applied via supply terminals 17 at all A/D conveters 4, 5 and 9 in the same manner. Since both signal channels 2, 4, 6 and 3, 5, 7 of sensor 1 are affected equally, the mutual plausibilization would result in a trigger case. However, because output signal 11 of monitoring A/D converter 9, which is likewise subject to the same fault 16, exceeds its specified limits 12 due to fault 16, as is clear from FIG. 2, this plausibility check, implementable internally or externally, correctly indicates that no trigger case exists in reality.

As a matter of fact, the evaluation—based on the assumption that a fault is present—would occur analogously (i.e., no trigger case) even if a real acceleration were to exist in addition, so that real output signals 14, 15 would be masked by fault 16 in this case.

It is advantageously possible to integrate at least one additional substitute circuit for a sensor element in the evaluation unit, which generates a fixed output signal that differs from that of substitute circuit 8. As a result, the input signal of additional A/D converter 9 is variable by switching over from substitute circuit 8 to an additional substitute circuit, so that a check of the functionality of monitoring means 8, 9, 13 may take place. Using the additional substitute circuit, a selectable fault, which acts solely on the redundant monitoring signal path, is able to be induced, so to speak.

What is claimed is:

1. An acceleration sensor for an occupant protection system in a vehicle, comprising:
   at least two micromechanical sensor elements for an acceleration pickup;
   an electronic evaluation unit which has a redundant signal path including a separate A/D converter for each of the at least two sensor elements; and
   a monitor to monitor parameters of the A/D converters associated with the sensor elements that are relevant for functionality of the A/D converters associated with the sensor elements to plausibilize output signals of the acceleration sensor, the monitor including a substitute circuit, integrated in the evaluation unit, for a sensor element, and a redundant further A/D converter, which reacts to changes in the parameters relevant for the functionality in the same sense as the A/D converters associated with the sensor elements, and the further A/D converter is configured to convert a fixed acceleration-independent output signal of the substitute circuit, a value of the digital output signal of the further A/D converter being compared to a predefined fixed limit with the aid of a comparator to detect changes in the parameters of all the A/D converters that are relevant for the functionality.

2. The acceleration sensor as recited in claim 1, wherein the acceleration sensor is configured to one of: i) provide a result of the plausibility check together with the output signals for external evaluation, or ii) prevent transmission of the output signals of the acceleration sensor that are internally evaluated as faulty.

3. The acceleration sensor as recited in claim 1, wherein at least one further substitute circuit for a sensor element is integrated in the evaluation unit, which is configured to generate a fixed output signal that differs from the substitute circuit, and an input signal of the further A/D converter is variable by switching from the substitute circuit to the further substitute circuit to check functionality of the monitor.

4. The acceleration sensor as recited in claim 1, wherein the acceleration sensor is a two-channel sensor, and the at least two micromechanical sensor elements are two redundantly provided sensor elements having different sensing directions.

5. The acceleration sensor as recited in claim 4, wherein the two-channel sensor has the two sensor elements in a v-shaped placement, which are rotated at 45.degree. plus/minus in relation to an axis of symmetry.

6. The acceleration sensor as recited in claim 4, wherein the micromechanical sensor elements are realized in a first chip, and the evaluation unit is realized in a second chip which is developed as an ASIC.

7. The acceleration sensor as recited in claim 4, wherein the three A/D converters each are developed as a sigma-delta modulator.

* * * * *